United States Patent [19]

Frye

[11] Patent Number: 5,121,122
[45] Date of Patent: Jun. 9, 1992

[54] FACADE CONSTRUCTION FOR HIGH STRUCTURES

[75] Inventor: Andreas Frye, Bremen, Fed. Rep. of Germany

[73] Assignee: Messerschmitt-Bölkow-Blohm GmbH, Ottobrunn, Fed. Rep. of Germany

[21] Appl. No.: 529,970

[22] Filed: May 29, 1990

[30] Foreign Application Priority Data

Jun. 6, 1989 [DE] Fed. Rep. of Germany ....... 3918383

[51] Int. Cl.⁵ ............................................. H01Q 17/00
[52] U.S. Cl. ............................................. 342/1; 342/4
[58] Field of Search ........................... 342/1, 4; 52/235

[56] References Cited

U.S. PATENT DOCUMENTS

| | | | |
|---|---|---|---|
| 3,349,397 | 10/1967 | Rosenthal | 342/1 |
| 3,737,903 | 6/1973 | Suetake et al. | 342/1 |
| 4,012,738 | 3/1977 | Wright . | |
| 4,038,660 | 7/1977 | Connolly et al. | 342/1 |
| 4,162,496 | 7/1979 | Downen et al. . | |
| 4,170,010 | 10/1979 | Reed | 342/1 |
| 4,327,364 | 4/1982 | Moore . | |

FOREIGN PATENT DOCUMENTS

| | | |
|---|---|---|
| 0238291 | 9/1987 | European Pat. Off. . |
| 844140 | 8/1960 | United Kingdom . |
| 2058469 | 4/1981 | United Kingdom . |

OTHER PUBLICATIONS

"Tables for the Design of Jaumann Microwave Absorber", Nortier et al., Microwave Journal, Sep. 1987, pp. 219–222.

"Hochfrequenz-absorbierende Materialien", Dominik et al., Electromagnetische Verträglichkeit ntz Bd. 41 (1988) Heft 5, pp. 280–283.

*Primary Examiner*—Mark Hellner
*Attorney, Agent, or Firm*—Toren, McGeady & Associates

[57] ABSTRACT

In a facade construction of high-rise structures, a corresponding layer construction is provided for suppressing reflections of incident electromagnetic waves, particularly of radar waves. For this purpose, an electrical resistance layer which has a surface resistance in the range of 300 to 1200 Ω is arranged at a distance from a reflecting surface. The distance between the reflecting surface and the electrical resistance layer is approximately ¼ of the wavelength in the propagation direction of incident electromagnetic waves to be suppressed.

12 Claims, 1 Drawing Sheet

5,121,122

FACADE CONSTRUCTION FOR HIGH STRUCTURES

BACKGROUND OF THE INVENTION

The invention is directed to a facade construction for high structures, such as buildings, with surfaces that reflect incident electromagnetic waves, particularly in the range of radar waves, wherein a covering arranged at a distance is arranged as a facade outer side, possibly with the intermediary of a heat insulating layer.

It has been shown in practice that problems arise due to large geometric dimensioning of buildings and the resulting large-planar contours with the use of electrically conducting or magnetic work materials when such structures are arranged in the immediate vicinity of directional radio links and air traffic installations (Airport Surveillance Radar). In such cases, reflections are produced by the buildings which critically impair the transmission quality of directional radio links and the tasks of an air traffic installation for the purpose of aircraft identification.

SUMMARY OF THE INVENTION

Accordingly, it is an object of the present invention to provide a narrow-band reflection suppression for structures of the generic type with the use of simple means according to the principle of interference, the narrow-band reflection suppression being tuned to the disturbing frequency range so that an impairment of directional radio links and ASR installations is prevented and it is possible to maintain conventional facade constructions.

Pursuant to this object, and others which will become apparent hereafter, one aspect of the present invention resides in an electrical resistance layer, with a surface resistance in the range of 300 to 1200 $\Omega_\square$, arranged at a distance from the reflecting surface. The distance of the formed electrical resistance layer from the reflecting surface is approximately ¼ of the wavelength in the propagation direction.

The wave components which occur in a determined angular area are accordingly reflected at the resistance layer, while the transmitting wave component is reflected by the reflecting surface after covering the distance and achieves interference cancellation with the wave component which reflects outward at the resistance layer, and accordingly eliminates a reflection.

In a further embodiment, the electrical resistance layer is formed on or in a carrier as a facade outer shell with slight transmission damping.

It is suggested that the carrier be formed from a ceramic material in order to provide a slight transmission damping. Alternatively, the carrier can be formed of a laminated material of compressed cellulose surfaces impregnated with synthetic resin. Another alternative construction can be carried out with a fiber composite building material.

In order to form the resistance layer, the resistance layer is formed from an aluminized fabric. Alternatively, resistance layers can be formed by means of a fabric of electrically conductive fibers or by means of a fabric with incorporated soot. In addition, according to another alternative, the resistance layer is formed inside a carrier by means of a formed film of electrically and-/or magnetically conductive material particles.

In order to achieve a favorable heat insulation, a spacing layer is formed between the reflecting surface and the resistance layer by means of a sandwich element. Alternatively, a spacing layer of a plurality of partial elements can be formed between the reflecting surface and the resistance layer and an additional resistance layer and/or a highly reflective additional layer can be arranged between the partial elements.

In addition, for forming an arrangement according to the invention, a metal foil or a close-meshed metal grate is arranged additionally on the reflecting surface.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENTS

Figure 1:
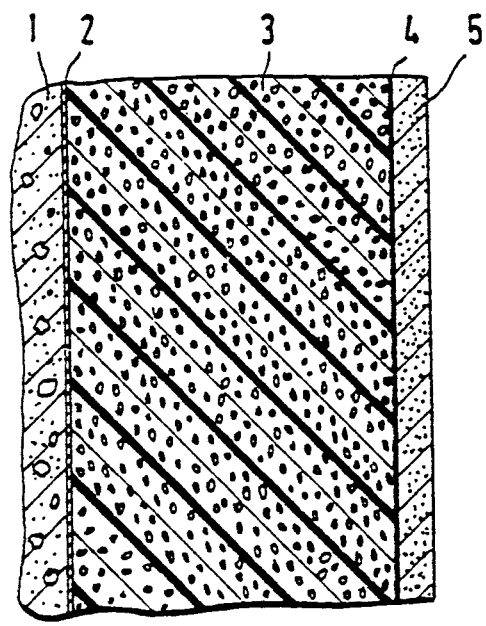
FIG. 1 shows a section through a facade construction with a one-piece heat insulating layer pursuant to the present invention.

In the construction shown in FIG. 1, an additional metal foil 2 is arranged, as reflection layer, on a reflecting building wall of steel-reinforced concrete 1. This is followed with a spacing layer 3 of an electrical nonconductor such as foam glass or plastic, e.g. polyurethane or mineral or rock wool, which forms a heat insulation. A resistance layer 4, which is covered by means of a carrier 5 as a facade outer shell, is arranged on this spacing layer 3 as sandwich element. The carrier 5 is formed from a material, such as ceramic material, with a slight transmission damping of the incident waves. The resistance layer 4 is constructed in such a way that it has a surface resistance between 300 and 1200 $\Omega_\square$.

Figure 2:
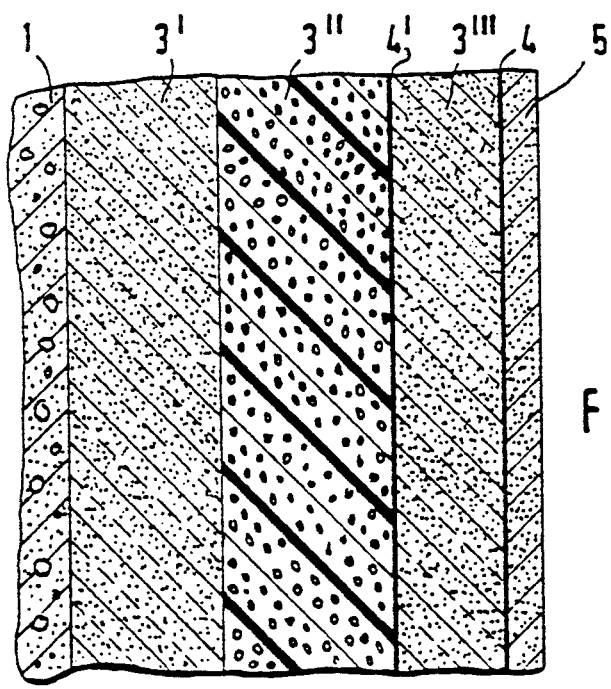
FIG. 2 shows a section according to FIG. 1 with a multiple-part heat insulating layer.

According to FIG. 2, another embodiment is shown in which, among other variants, the spacing layer 3 is formed by means of a plurality of partial elements 3', 3" and 3''', an additional resistance layer 4' also being located between the latter.

Of course, it is also possible to arrange a corresponding reflection layer 2 as an additional layer between the partial elements 3', 3" and 3'''.

A corresponding reflection suppression takes place according to FIG. 1 as follows:

After a radar wave of 1.1 GHz strikes the carrier 5, whose reflection characteristic is determined by the resistance layer 4, wave components are reflected.

The non-reflecting components pass through the intermediate layer 3, which does not absorb more than 10% of the wave components, and strike the reflecting layer 2. The distance of the reflecting layer 2 from the resistance layer 4 and carrier 5 is approximately ¼ of the wavelength of the wave in the propagation direction. A distance of 35 to 55 mm results at a vertical incidence of the radar wave of approximately 1.0 GHz.

The wave component returning from the reflecting layer 2 achieves interference cancellation with the wave component which reflects outward at the resistance layer 4, so that a reflection is eliminated.

In this way, a reflection suppression is achieved which realizes a reflection R < −20dB, i.e. less than 1% compared to the incident energy, in the frequency range of 1.0 GHz to 1.1 GHz.

While the invention has been illustrated and described as embodied in a facade construction for high structures, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by letters patent is set forth in the appended claims.

1. A facade construction for highrise structures, comprising:
    a surface (1) which reflects incident electromagnetic waves;
    a carrier (5) having slight wave transmission damping and being provided as a covering arranged at a distance from the reflecting surface so as to form a weather resistant facade outer side, the carrier being formed of one of a ceramic material, a laminate material and a fiber cement; and
    an electrical resistance layer (4), with a surface resistance in a range of 300 to 1200 $\Omega_\square$, formed on or in said carrier (5) and arranged at a distance from the reflecting surface (1), the distance of the formed electrical resistance layer (4) from the reflecting surface (1) being approximately $\frac{1}{4}$ of the wavelength of the electromagnetic waves in a wave-propagation direction.

2. A facade construction according to claim 1, wherein the electromagnetic waves are in the frequency range of radar waves.

3. A facade construction according to claim 1, and further comprising a heat insulating layer arranged between the reflecting surface and the covering.

4. A facade construction according to claim 1, wherein the carrier (5) is formed by a laminate material of compressed cellulose surface impregnated with a synthetic resin.

5. A facade construction according to claim 1, wherein the resistance layer (4) is formed from an aluminized fabric.

6. A facade construction according to claim 1, wherein the resistance layer (4) is formed by means of a fabric with incorporated soot.

7. A facade construction according to claim 1, wherein the resistance layer (4) is a fabric of electrically conductive fibers.

8. A facade construction according to claim 1, wherein the resistance layer (4) is formed inside the carrier (5) by means of a formed film having at least one of electrically and magnetically conductive material particles.

9. A facade construction according to claim 1, wherein a spacing layer (3) is formed by a sandwich element between the reflecting surface (1) and the resistance layer (4).

10. A facade construction according to claim 1, wherein a spacing layer (3) of a plurality of partial elements (3', 3'', 3''') is formed between the reflecting surface (1) and the resistance layer (4), and at least one of an additional resistance layer (4') and a highly reflective additional layer is arranged between the partial elements (3', 3'', 3''')

11. A facade construction according to claim 1, wherein a metal foil (2) is additionally arranged on the reflecting surface (1).

12. A facade construction according to claim 1, wherein a close-meshed metal grate is additionally arranged on the reflecting surface (1).

* * * * *